United States Patent [19]

Tokumo et al.

[11] Patent Number: 4,949,048
[45] Date of Patent: Aug. 14, 1990

[54] PULSE WIDTH MODULATION AMPLIFIER CIRCUIT

[75] Inventors: Akio Tokumo; Masayuki Kato; Takeshi Sato; Tatsuzo Hasegawa, all of Saitama, Japan

[73] Assignee: Pioneer Electronic Corporation, Tokyo, Japan

[21] Appl. No.: 433,234

[22] Filed: Nov. 8, 1989

[30] Foreign Application Priority Data

Dec. 28, 1988 [JP] Japan .................... 63-328811

[51] Int. Cl.$^5$ ............................................ H03F 3/38
[52] U.S. Cl. ...................................... 330/10; 330/251; 330/295
[58] Field of Search ................. 330/10, 124 R, 207 A, 330/251; 323/283; 363/26, 41

[56] References Cited

U.S. PATENT DOCUMENTS

| | | | |
|---|---|---|---|
| 3,336,538 | 8/1967 | Crowhurst | 330/207 A |
| 3,629,616 | 12/1971 | Walker | 307/254 |
| 4,673,889 | 6/1987 | Cini et al. | 330/10 |

FOREIGN PATENT DOCUMENTS

| | | |
|---|---|---|
| 0183849 | 6/1986 | European Pat. Off. . |
| 2843425 | 4/1980 | Fed. Rep. of Germany . |
| 3146560 | 8/1982 | Fed. Rep. of Germany . |
| 3112035 | 7/1983 | Fed. Rep. of Germany . |
| 2524072 | 6/1984 | Fed. Rep. of Germany . |
| 3538661 | 1/1987 | Fed. Rep. of Germany . |

OTHER PUBLICATIONS

"Schaltungstechnik des D-Verstarkers", Radio Fernsehen Elektronik 24, 1975, pp. 789–793.
"Applikator", Elektor, Apr. 1987, pp. 71–73.
"PDM-Verstarker", Verstarkertechnik, 1988, pp. 34–36.
"Design Considerations in Class D MOS Power Amplifiers", John Murray et al., IEEE Transactions on Industrial Electronics and Control Instrumentation, Nov. 1979, pp. 211–218.

*Primary Examiner*—James B. Mullins
*Attorney, Agent, or Firm*—Sughrue, Mion, Zinn, Macpeak & Seas

[57] ABSTRACT

A pulse width modulation amplifier circuit includes a comparator which receives an analog signal and generates first and second analog signals having a phase difference of 180 degrees. A phase shifting circuit produces first and second triangular wave carrier signals so as to establish therebetween a phase difference of approximately 90 degrees. First and second pulse width modulation amplifiers, having output terminals connected to a load, pulse width modulate the first and second triangular wave carrier signals with said first and second analog signals, respectively, and amplify resultant pulse width signals.

5 Claims, 3 Drawing Sheets

PULSE WIDTH MODULATION AMPLIFIER CIRCUIT

The present invention relates to a pulse width modulation amplifier circuit, and particularly relates to a balanced transformer-less (BTL) circuit in which analog signals to be applied to two pulse width modulation amplifiers are made to have opposite phases, and opposite ends of a load are connected to the respective output terminals of the two pulse width modulation amplifiers.

BACKGROUND OF THE INVENTION

A pulse width modulation (PWM) amplifier is configured so that a high-frequency triangular wave carrier signal is modulated with an analog signal, for example, an audio signal or the like, so as to be converted into a pulse width signal. The pulse width signal is power-amplified, and then demodulated by removing the carrier signal through a filter immediately before the pulse width signal is applied to a load, such as a speaker or the like. Recently, the foregoing PWM amplifier has been used in mobile audio equipment or the like because of the excellent efficiency of the PWM amplifier in a power amplifying operation.

FIG. 5 shows an example of a conventional PWM amplifier in which an input terminal 1 receives an analog signal. The analog signal is applied to an inverted input terminal of a comparator 2. Simultaneously, the high-frequency output (for example, 200 kHz) of a triangular wave carrier oscillator 3 is applied to a non-inverted input terminal of the comparator 2. Thus, the carrier signal is modulated with the analog signal so as to be converted into a pulse width signal. After being applied through a drive amplifier 4, the pulse width signal obtained from the comparator 2 is amplified by a pulse amplifier (power amplifier) 5 constituted by N-channel MOS power FETs. After the carrier signal is separated from the pulse width signal by a filter circuit which includes a choke coil 6 and a capacitor 7, the demodulated signal actuates, for example, a speaker 9 or the like connected to an output terminal 8.

FIG. 6 shows a conventional pulse width modulation amplifier circuit using a pair of such PWM amplifiers as described above to form a BTL circuit.

In this BTL circuit, an analog signal applied to an input terminal 1 is converted by a differential circuit 10 or the like into first and second analog signals which are different in phase from each other by 180 degrees. Then, the first analog signal is converted by a first comparator 2 into a pulse width signal, which is in turn applied to a choke coil 6 through a drive amplifier 4 and a pulse amplifier 5. Thereafter, the first signal applied to the choke coil 6 is applied to an output terminal 8 after a carrier of the signal has been removed by the choke coil 6 and a capacitor 7 (the filter elements).

Similarly, the second analog signal is converted by a second comparator 2' into a pulse width signal, which in turn is applied to a choke coil 6' through a drive amplifier 4' and a pulse amplifier 5'. Then, the second signal applied to the choke coil 6' is applied to an output terminal 8' after a carrier of the signal has been removed by the filter consisting of a choke coil 6' and a capacitor 7'.

A load 9, for example, a speaker or the like, is connected at its opposite ends to the output terminals 8 and 9, respectively. Therefore, the demodulated analog outputs produced by the PWM amplifiers are applied to the load 9 in an antiphase relation. As such, a voltage across the opposite ends of the load 9 is twice as much as an output voltage obtained by one PWM amplifier, so that, theoretically, electric power which is four times larger than when using one PWM amplifier can be supplied to the load 9.

In the foregoing BTL-PWM amplifier, a triangular wave carrier signal d from one oscillator 3 is applied commonly to the respective comparators 2 and 2' of the two PWM amplifiers so that an analog signal is pulse-width modulated by the comparators 2 and 2'.

The output of the common oscillator 3 is applied, as the triangular wave carrier signal d, to the two PWM amplifiers in the foregoing manner based upon the generation of pulses and the cost factor.

Therefore, when both the input analog signals a and a' to the two PWM amplifiers are zero, square wave pulse outputs b and b' of the pulse amplifiers 5 and 5' are in phase so that they increase and decrease simultaneously as shown in FIGS. 3(a) and 3(b). When the analog signals a and a' achieve a predetermined level, the pulse outputs of the pulse amplifiers 5 and 5' are modulated so that the respective duty factors of the pulse outputs are changed according to the analog signals, as shown in FIG. 3(c). In this situation, the linearity of the triangular wave carrier signal to be applied to the comparators 2 and 2' must be maintained. Hence, if the linearity of the triangular wave deteriorates, an error is generated in converting a voltage level into a pulse width, thereby causing distortion. Therefore, an oscillator 3 having satisfactory performance generally is used.

However, when each of the pulse amplifiers 5 and 5' switches high electric power according to the input pulse, a sharp change in the power supply current results so that power supply voltage also is affected. Because of this change in the power supply voltage, noise spikes sometimes are superimposed on the output waveform of the oscillator 3. As a result, the linearity of the triangular wave carrier signal generated from the oscillator 3 is reduced, so as to reduce the distortion generated.

In the BTL-PWM amplifier of FIG. 6, the analog signals a and a' to be applied to the first and second comparators 2 and 2', respectively, have a phase difference of 180 degrees therebetween. Therefore, the first and second pulse width signals produced from the respective comparators 2 and 2, change in opposite phase.

Consequently, when switching is performed in the pulse amplifier 5 or 5' to correspond to one of the analog signals a or a' and a noise spike thereby is generated, the other analog signal a or a' is compared in the comparator 2 or 2'. As a result, the linearity of the triangular wave carrier signal applied to the comparator 2 or 2' at this time is distorted by the spike noise. Therefore, an error is generated in converting a voltage to a pulse width in the comparator 2 or 2,, so that the distortion worsens.

The present invention has been developed in view of the foregoing problems peculiar to the conventional BTL-PWM amplifier, and is designed to prevent distortion which may be caused when the linearity of a triangular wave applied to one PWM amplifier is deteriorated by a spike noise generated during the switching of the other PWM amplifier.

SUMMARY OF THE INVENTION

The foregoing and other objects of the invention have been achieved by the present invention which has a feature in which a phase difference of approximately 90 degrees is provided between the respective triangular wave carrier signals to be applied to the first and second comparators, so that the switching times do not approach each other at a low input signal level of up to 50% modulation. Thus, distortion due to mutual interference is prevented.

BRIEF DESCRIPTION OF THE DRAWINGS

The above and other objects, features, and advantages of this invention will become more apparent from the following detailed description when read in conjunction with the accompanying drawings in which.

DETAILED DESCRIPTION OF THE PREFERRED EMBODIMENT

Figure 1:
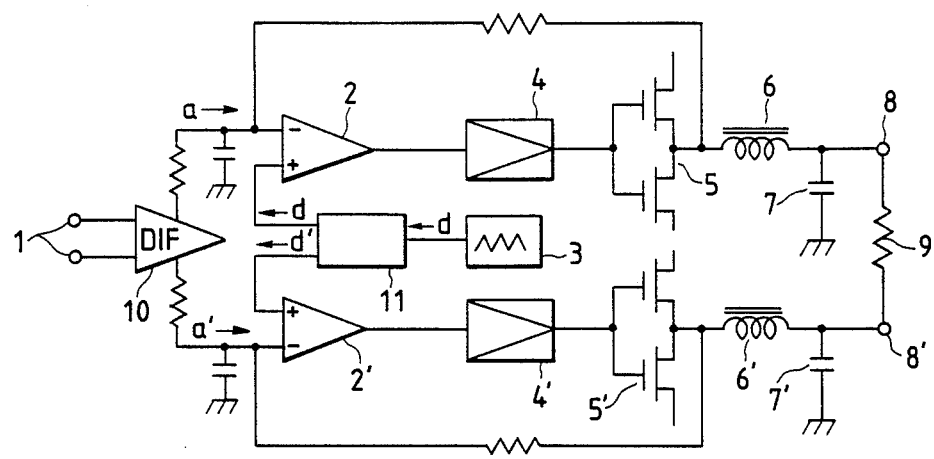
FIG. 1 is a block diagram showing an embodiment of the present invention.
Figure 2:
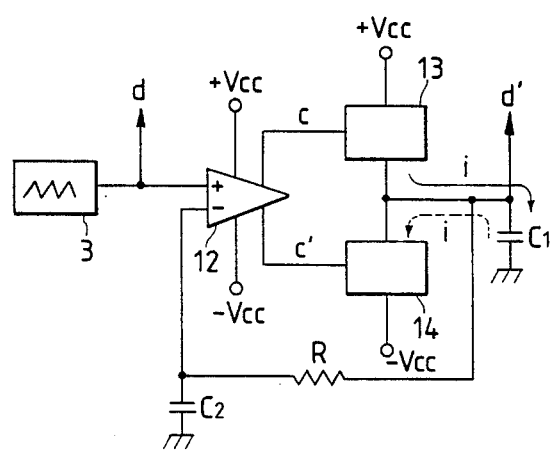
FIG. 2 is a block diagram showing an example of the phase shifting circuit used according to the invention.

Referring to FIGS. 1 and 2, the pulse width modulation amplifier circuit according to the present invention will be described hereunder.

Figure 6:
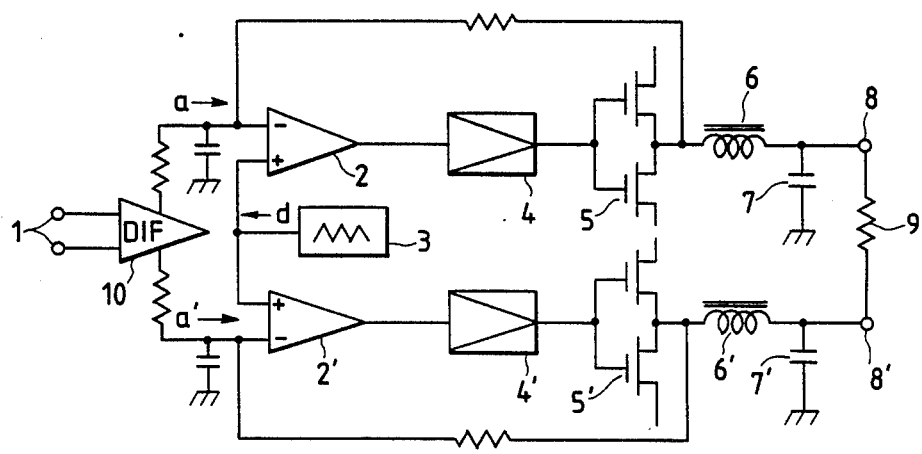
FIG. 6 is a block diagram showing the conventional pulse width modulation amplifier circuit of a BTL configuration.

FIG. 1 shows the configuration of an embodiment of the pulse width modulation amplifier circuit according to the present invention. This embodiment differs from the conventional BTL-PWM amplifier shown in FIG. 6 in that a phase shifting circuit 11 is provided between a carrier oscillator 3 and two comparators 2 and 2', and controls the phase difference between triangular wave carriers to be approximately 90 degrees.

FIG. 2 shows a specific example of the phase shifting circuit 11 in which a triangular carrier signal d from an oscillator 3 is applied to a non-inverting input terminal of a comparator 12 and therein compared with the middle-point voltage (0 volts) being applied to an inverting input terminal of the comparator 12.

Figure 4:
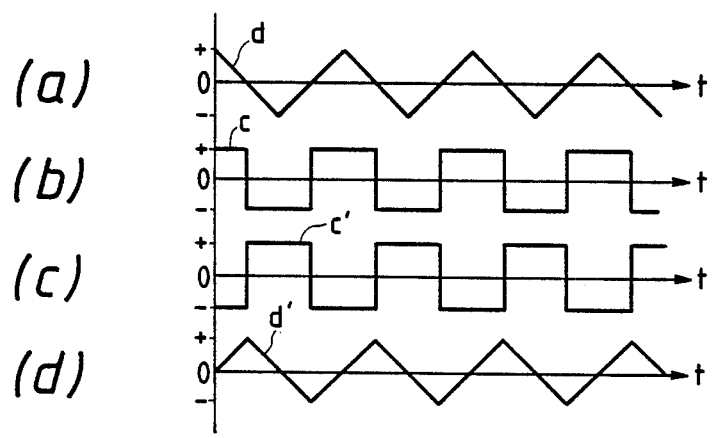
FIG. 4 is a diagram showing signal waveforms at various components of FIG. 2.
Figure 5:
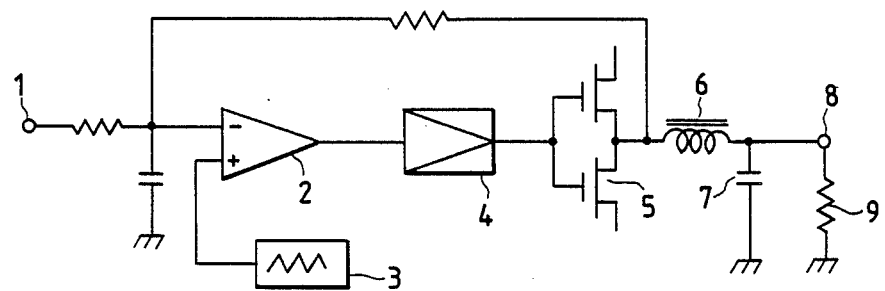
FIG. 5 is a block diagram for explaining the fundamental configuration of the pulse width modulation amplifier.

As shown in FIG. 4(a), the triangular carrier signal d has positive peaks and negative peaks of the same amplitude from the zero level. Referring to FIG. 4(b), when the signal d crosses zero voltage from negative to positive, the comparator 12 is switched to produce a high-level positive-phase output Alternatively, as shown in FIG. 4(c), when the carrier signal d crosses zero voltage from positive to negative, the comparator 12 is switched to produce a low-level positive-phase output c and a high-level negative-phase output c'.

The positive-phase output c and negative-phase output c' are provided to constant current sources 13 and 14, respectively. The constant current source 13 is turned on by the high-level positive-phase output c and turned off by the low-level output c. Similarly, the constant current source 14 is turned on by the high-level negative-phase output c' and turned off by the low-level output c'.

Each of the constant current sources 13, 14 output a constant current i during its ON operation. Therefore, the current sources 13, 14 alternately charge and discharge, with the constant current i, a capacitor $C_1$ provided between the connection point of the current sources 13, 14 and the ground. As a result, a triangular wave signal d' as shown in FIG. 4(d) is produced at a terminal of the capacitor $C_1$, which lags 90 degrees in phase from the carrier signal d outputted from the oscillator 3. A peak value of the carrier signal d' can be made equal to that of the carrier signal d by properly selecting values of the constant current i and the capacitance $C_1$.

The triangular carrier signal d, also is applied to a low-pass filter consisting of a resistor R and a capacitor $C_2$. The output of this low-pass filter is fed-back to the inverted input terminal of the comparator 12 to maintain the above-mentioned middle-point (0 volts) voltage.

Figure 3:
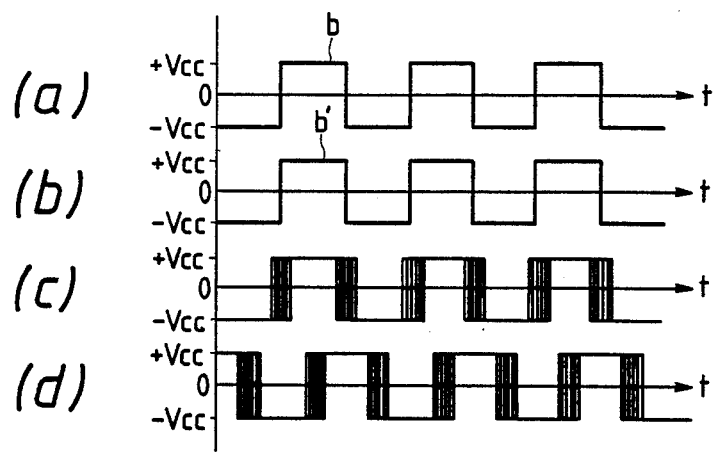
FIG. 3 is a signal waveform diagram for explaining the operation of pulse width modulation.

Then, if the thus obtained carrier signals d and d' having a phase difference of 90 degrees therebetween are applied to the respective non-inverted terminals of the first and second comparators 2 and 2' of FIG. 1, square wave pulse signals obtained in the pulse amplifiers 5 and 5' through pulse width modulation in the comparators 2 and 2' have the relation shown in FIGS. 3(c) and 3(d). As a result, the square wave pulse signals do not increase or decrease simultaneously even if the duty factors thereof vary up to 50% modulation, and no distortion occurs. Even when interference is generated by inputs of 50% modulation or more, no problem occurs since the signal level now has become sufficiently high in comparison with a distortion component due to the interference.

Although the phase difference between the carrier signals d and d' has been set to 90 degrees in the foregoing embodiment, a phase difference of exactly 90 degrees is not required. Therefore, the value may be approximately 90 degrees. In short, the phase difference may be set to any value so long as the square wave pulses obtained from the first and second comparators 2 and 2' do not coincide with each other while increasing and decreasing in a required modulation range when the duty factors vary due to modulation.

FIGS. 3(c) and 3(d) show the change in the duty factors in a middle and low level modulation range. These ranges of the change in the duty factors are separated precisely from each other. p Therefore, switching noise generated in such a state do not result in a mutually poor effect on the signals, so that distortion does not worsen.

As seen from the foregoing, in the pulse width modulation amplifier circuit according to the present invention, the modulated square wave pulse signals in the first and second PWM amplifiers constituting the BTL do not coincide with each other while increasing or decreasing so that distortion can be prevented, and, therefore, comprehensive distortion characteristics can be improved.

While certain preferred embodiments have been shown and described, many changes and modifications within the spirit of the invention will be apparent to those of working skill in this technical field.

What is claimed is:

1. A pulse width modulation circuit comprising:

generating means receiving an analog signal, for generating first and second analog signals having phases different from each other by 180 degrees;

phase shifting means for producing first and second high frequency carrier signals having phases different from each other by approximately 90 degrees; and first and second pulse width modulation amplifier means for pulse width modulating said first and second high frequency carrier signals with said first and second analog signals, respectively, and amplifying resultant pulse width signals, respectively, output terminals of said first and second pulse width modulation amplifier means being connected to opposite ends of a load.

2. A pulse width modulation amplifier circuit as defined in claim 1, wherein said phase values of said first and second high frequency signals differ by 90 degrees.

3. A pulse width modulation amplifier circuit as defined in claim 1, wherein said first and second high frequency carrier signals are triangular wave signals.

4. A pulse width modulation amplifier circuit as defined in claim 1, wherein said generating means comprises a differential circuit.

5. A pulse width modulation amplifier circuit as defined in claim 1, wherein each of said first and second pulse width modulation amplifier means comprises a comparator and an amplifier.

* * * * *